(12) United States Patent
Peng et al.

(10) Patent No.: US 10,264,683 B2
(45) Date of Patent: Apr. 16, 2019

(54) GUIDE AND SUPPORT APPARATUS FOR PRINTED CIRCUIT BOARD

(71) Applicant: Honeywell International Inc., Morris Plains, NJ (US)

(72) Inventors: Wen Peng, Shanghai (CN); Chaohong Liu, Shanghai (CN); Lei Jiang, Shanghai (CN)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 15/282,279

(22) Filed: Sep. 30, 2016

(65) Prior Publication Data

US 2017/0094826 A1 Mar. 30, 2017

Related U.S. Application Data

(63) Continuation of application No. PCT/CN2015/091180, filed on Sep. 30, 2015.

(51) Int. Cl.
*H05K 7/12* (2006.01)
*H05K 3/36* (2006.01)
*H05K 1/14* (2006.01)
*H05K 7/14* (2006.01)
*G06F 1/18* (2006.01)

(52) U.S. Cl.
CPC ............. *H05K 3/366* (2013.01); *G06F 1/185* (2013.01); *H05K 1/141* (2013.01); *H05K 7/1404* (2013.01); *H05K 7/1405* (2013.01); *H05K 7/1418* (2013.01); *H05K 2201/10393* (2013.01); *H05K 2201/10424* (2013.01)

(58) Field of Classification Search
CPC ...... H05K 7/14; H05K 7/1405; H05K 7/1418; H05K 3/336
USPC .......... 361/801–802, 756–759; 439/153, 326
See application file for complete search history.

(56) References Cited

U.S. PATENT DOCUMENTS

| 3,932,016 A | 1/1976 | Ammenheuser |
| 4,008,942 A | 2/1977 | Grossi |
| 4,894,753 A | 1/1990 | Wadell et al. |
| 5,267,872 A | 12/1993 | Gou et al. |

(Continued)

FOREIGN PATENT DOCUMENTS

| CN | 201041843 Y | 3/2008 |
| CN | 201773984 U | 3/2011 |

OTHER PUBLICATIONS

Extended Eurppean Search Report dated Jan. 23, 2017 in connection with European Application No. 16191212.6-1803, 10 pages.

(Continued)

*Primary Examiner* — Tuan T Dinh
(74) *Attorney, Agent, or Firm* — Kermit D. Lopez; Luis M. Ortiz; Loza & Loza, LLP

(57) ABSTRACT

A guide and support apparatus is provided. The guide and support apparatus comprises a mounting portion, a support portion, and a guide and lock portion. The support portion extends to the guide and lock portion and ends at the mounting portion. The mounting portion extends downward from one or two ends of the support portion and comprises a lock structure. The guide and lock portion extends from the support portion to a certain height. Further, a method for manufacturing the guide and support apparatus is provided.

15 Claims, 12 Drawing Sheets

(56) References Cited

U.S. PATENT DOCUMENTS

| | | | |
|---|---|---|---|
| 5,726,865 A | | 3/1998 | Webb et al. |
| 5,980,295 A | | 11/1999 | Lai et al. |
| 6,159,031 A | * | 12/2000 | Llapitan ............. H01R 13/6275 |
| | | | 439/326 |
| 6,166,920 A | * | 12/2000 | Schweers ................ G06F 1/183 |
| | | | 361/756 |
| 6,381,149 B1 | * | 4/2002 | Megason ............. H05K 7/1405 |
| | | | 361/756 |
| 7,641,495 B1 | * | 1/2010 | Sun ........................ H05K 3/366 |
| | | | 439/327 |
| 7,848,116 B2 | * | 12/2010 | Duppong ............... H05K 3/366 |
| | | | 361/759 |
| 8,388,362 B2 | * | 3/2013 | Su ...................... H01R 12/7029 |
| | | | 439/153 |
| 2007/0258195 A1 | | 11/2007 | Liu et al. |

OTHER PUBLICATIONS

International Searching Authority, "Notification of Transmittal of the International Search Report and the Written Opinion of the International Searching Authority, or the Declaration," International Application No. PCT/CN2015/091180, dated Jun. 15, 2016, 12 pages, State Intelletual Property Office of the P.R. China (ISA/CN), Beijing, China.

* cited by examiner

GUIDE AND SUPPORT APPARATUS FOR PRINTED CIRCUIT BOARD

CROSS-REFERENCE TO RELATED APPLICATION AND PRIORITY CLAIM

This application claims priority as a continuation of International Patent Application No. PCT/CN2015/091180 filed on Sep. 30, 2015. This international patent application is hereby incorporated by reference in its entirety.

TECHNICAL FIELD

Embodiments described herein generally relate to a support apparatus for an electronic device, and more particularly, to a guide and support apparatus for a printed circuit board.

BACKGROUND

In electronic devices, a printed circuit board is usually employed to carry various electronic components for carrying out several functions. The component density now is becoming higher and higher in order to achieve more functions with less space. This requires the mechanical structure to be compact and efficient. To this end, the different portions of the printed circuit board are modularized and connected together perpendicularly.

FIGS. 1A and 1B show an assembled printed circuit board in accordance with the prior art. Several child boards 1 are held on a mother board 7 by guide rails 2 and 3. As shown in FIGS. 1A and 1B, the guide rails 2 are placed perpendicularly to a front side of the mother board 7 and fixed by screws 5 on the opposed back side of the mother board 7. The guide rails 3 are mounted perpendicularly on the mother board 7 with lock heads 6 passing through holes of the mother board 7 to the back side and with lock wings 4 against the front side. The child boards 1 are supported and locked between two guide rails 2, two guide rails 3, or one guide rail 2 and one guild rail 3. In this way, it is easy for the child board 1 to be mounted on the mother board 7 and occupy less space.

However, in the case where the mother board carries many child boards and has a lot of electronic components to be mounted thereon, the existing guide and support structure cannot meet the high density requirement.

Therefore, there is a need for an improved guide and support apparatus that saves more space and is easy to use.

SUMMARY

In one embodiment, a guide and support apparatus is provided. The guide and support apparatus comprises a mounting portion, a support portion, and a guide and lock portion. The support portion extends perpendicularly to the guide and lock portion and ends at the mounting portion. The mounting portion extends downward from one or two ends of the support portion and comprises a lock structure. The guide and lock portion extends from the support portion vertically to a certain height.

In another embodiment, a further guide and support apparatus is provided. The further guide and support apparatus comprises a support portion and a guide and lock portion. The guide and lock portion extends from the support portion vertically to a certain height, where the guide and lock portion includes first and second guide and lock portions. The guide and lock portion comprises two ribs that extend up to a certain height from the support portion and that are connected by a lock portion on their top ends. A slot extends between the two ribs and ends with the lock portion. The lock portion is positioned between the two ribs and has a top surface and a front surface. Two projections are formed next to the lock portion such that a groove is defined by the front surface of the lock portion and the two projections. The top surface of the lock portion is inclined relative to the front side of the ribs.

In another embodiment, aboard matrix is provided. The board matrix comprises a child board, a mother board, and the guide and support apparatus according to the above embodiment.

In another embodiment, a method for manufacturing a guide and support apparatus is provided. The method comprises forming a support portion, forming a guide and lock portion that extends from the support portion to a certain height, and forming a mounting portion. The support portion extends perpendicularly to the guide and lock portion and ends at the mounting portion. The mounting portion extends downward from one or two ends of the support portion and comprises a lock structure. The lock structure is below the support portion.

BRIEF DESCRIPTION OF THE DRAWINGS

Understanding that the drawings depict only exemplary embodiments and are not therefore to be considered limiting in scope, the exemplary embodiments will be described with additional specificity and detail through the use of the accompanying drawings, in which.

Figure 1A:
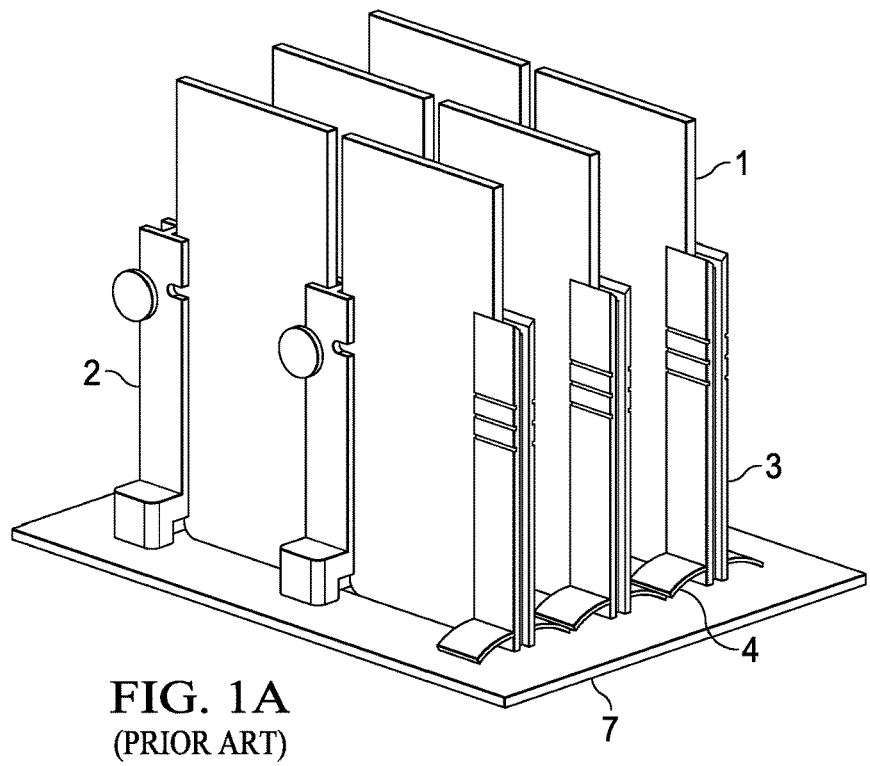
FIGS. 1A and 1B show an assembled printed circuit board in accordance with the prior art.

In accordance with common practice, the various described features are not drawn to scale but are drawn to emphasize specific features relevant to the exemplary embodiments.

DETAILED DESCRIPTION

In the following detailed description, reference is made to the accompanying drawings that form apart hereof and in which are shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

As used herein, the terms "having," "containing," "including," "comprising," and the like are open-ended terms that indicate the presence of stated elements or features but do not preclude additional elements or features. The articles "a," "an," and "the" are intended to include the plural as well as the singular, unless the context clearly indicates otherwise.

Figure 2A:
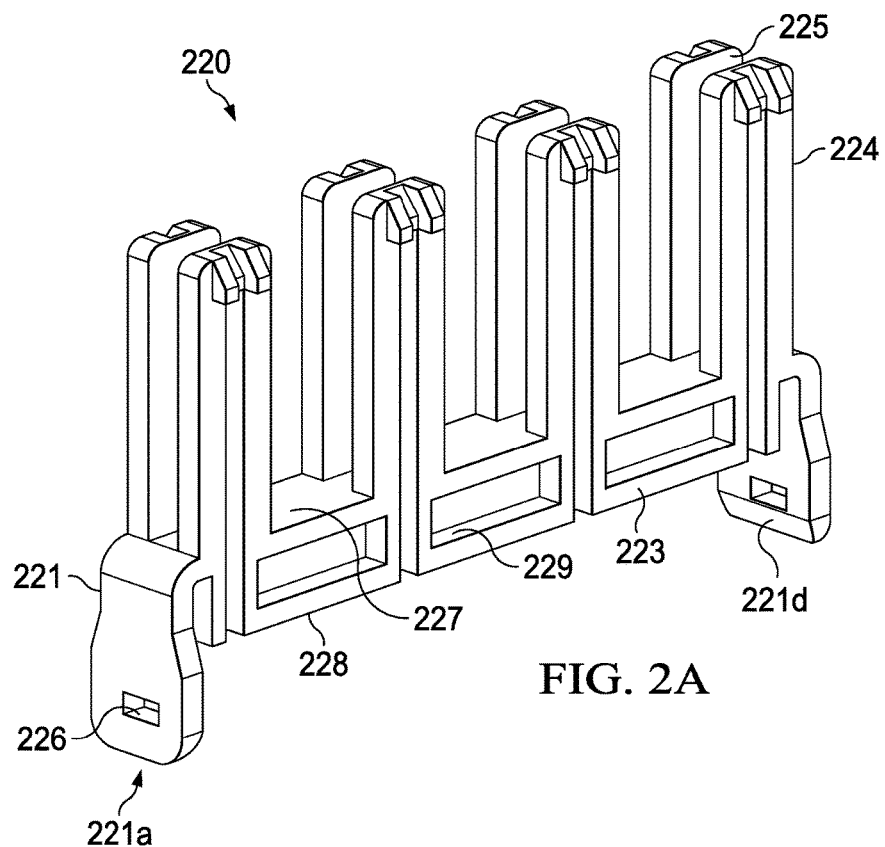
FIG. 2A shows an example embodiment of a guide and support apparatus according to the disclosure.

FIG. 2A shows an example embodiment of a guide and support apparatus 220 according to the disclosure. The guide and support apparatus 220 includes a mounting portion 221, a support portion 223, and a guide and lock portion 224, 225. The support portion 223 extends perpendicularly to the guide and lock portion 224, 225 and is ended with the mounting portion 221. The support portion 223 includes a top surface 227 and a bottom surface 228 (not shown).

The mounting portion 221 extends downward from one or two ends where the support portion 223 is ended. The mounting portion 221 may be angled relative to the top surface 227 and bottom surface 228 and preferably is perpendicular to the top surface 227 and bottom surface 228. The mounting portion 221 includes a foot 221a, and a hole 226 is formed in the foot 221a. The level of the hole 226 is below the bottom surface 228 of the support portion 223, i.e. the peak in the hole 226 is below the bottom surface 228 of the support portion 223, such that there is a space formed between the support portion 223 and an upper side of a mother board, i.e. the support portion 223 does not contact the mother board, when the guide and support apparatus 220 is mounted on the mother board. The mounting portion 221 can be flat, and the holes 226 formed in the feet 221a of the mounting portions 221 extending from the different ends of the support portion 223 face each other and are preferably aligned with each other. The inner side at the bottom of the foot 221a can be cutoff partly to form a slope face 221d. The hole 226 can be shaped as a rectangle, square, circle, ellipse, triangle, or any other suitable shape. The person skilled in the art should realize from the above description that two or more holes that are located at the same level or different levels can be formed in one foot, although only one hole 226 is shown in each foot.

There are several concaves 229 on the front side and the back side of the support portion 223 to strengthen the support portion 223 and to reduce the weight of the structure.

The guide and lock portion 224, 225 includes one or more first guide and lock portions 224 and one or more second guide and lock portions 225 (for example, preferably, four first guide and lock portions 224 and four second guide and lock portions 225 in this embodiment), which all extend from the bottom surface 228 through the top surface 227 up to a certain height. As seen in FIG. 2A, the first guide and lock portion 224 is located on the front side and the second guide and lock portion 225 is located on the back side of the support portion 223. The two kinds of guide and lock portion 224 and 225 are back to back, parallel, and aligned with each other. There are guide and lock structures facing outward on the guide and lock portion as described below. The concaves 229 are formed between two adjacent guide and lock portions along each side of the support portion 223.

The mounting portion 221, the support portion and the guide and lock portion 224, 225 may be separate parts that can be assembled together by screw, pressing fit, or snapping fit, or they can be integral. Some or all of the mounting portion 221, the support portion 223, and the guide and lock portion 224, 225 can be manufactured by injection molding, machining, bending, or any other manufacturing process that can form the structure from any suitable material, such as plastic, sheet metal, and so on.

Figure 2B:
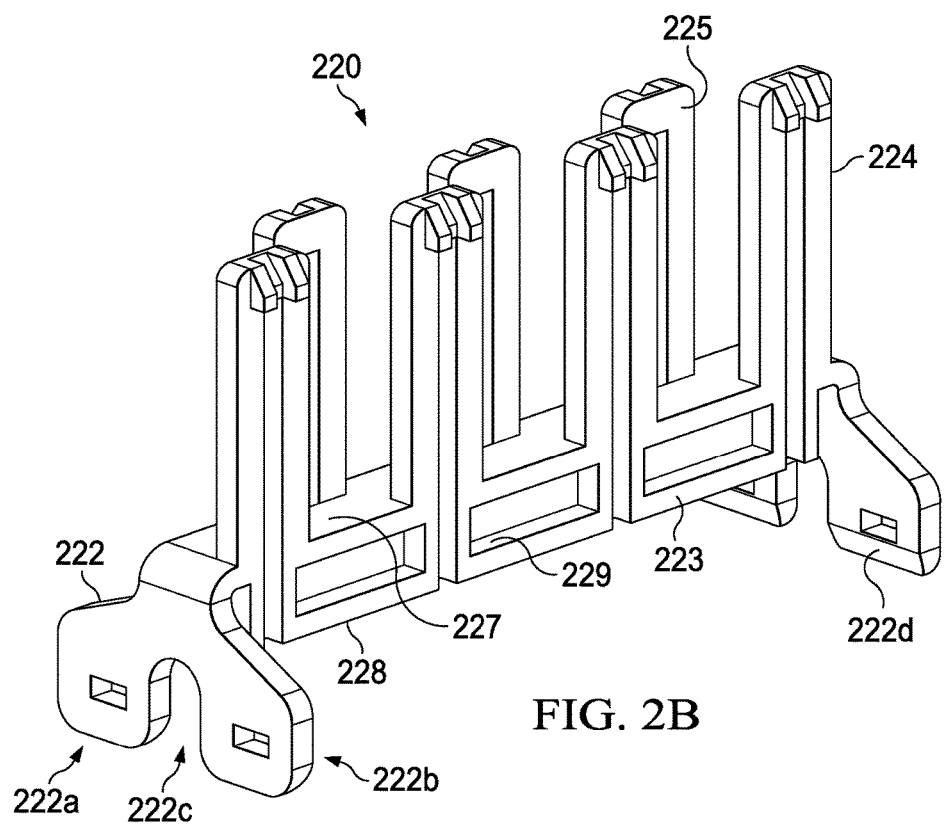
FIG. 2B shows another embodiment of a guide and support apparatus according to the disclosure.

FIG. 2B shows another embodiment of a guide and support apparatus 220 according to the disclosure. As seen in FIG. 2B, the guide and support apparatus 220 includes a mounting portion 222, a support portion 223, and a guide and lock portion 224, 225. The support portion 223 extends perpendicularly to the guide and lock portion 224, 225 and is ended with the mounting portion 222. The support portion 223 includes a top surface 227 and a bottom surface 228 (not shown).

The mounting portion 222 extends downward from one or two ends where the support portion 223 is ended. The mounting portion 222 may be angled relative to the top surface 227 and bottom surface 228 and preferably is perpendicular to the top surface 227 and bottom surface 228. The mounting portion 222 includes two feet 222a and 222b that are separated by a slot 222c. A hole 226 is formed in each of the feet 222a and 2b. As shown in FIG. 2B, the holes 226 formed in different feet are located at the same level that are below the bottom surface 228 of the support portion 223 such that there is a space formed between the support portion 223 and a upper side of a mother board when the guide and support apparatus 220 is mounted onto the mother board. The mounting portion 222 can be flat, and the holes 226 formed in the feet 222a and 222b of the mounting portions 222 extending from the different ends of the support portion 223 face each other and are preferably aligned with each other. The hole 226 can be shaped as a rectangle, square, circle, ellipse, triangle, or any other suitable shape. The person skilled in the art should realize from above description that two or more holes that are located at the same level or different levels can be formed in one foot, although only one hole 226 is shown in each foot.

There are several concaves 229 on the front side and the back side of the support portion 223 to strengthen the support portion 223 and to reduce the weight of the structure.

The guide and lock portion 224, 225 includes one or more first guide and lock portions 224 and one or more second guide and lock portions 225 (for example, preferably, four first guide and lock portions 224 and three second guide and lock portions 225 in this embodiment), which all extend from the bottom surface 228 through the top surface 227 up to a certain height. As seen in FIG. 2B, the first guide and lock portion 224 is located on the front side and the second guide and lock portion 225 is located on the back side of the support portion 223. The two kinds of guide and lock portions 224 and 225 are arranged to be back to back, parallel, and interleaved but not aligned with each other. There are guide and lock structures facing outward on the guide and lock portions 224 and 225 as described below. The concaves 229 are formed between two adjacent guide and lock portions along each side of the support portion 223 or between the guide and lock portion and the end of the support portion 223.

Similar to the structure in FIG. 2A, the mounting portion 222, the support portion 223, and the guide and lock portion 224, 225 in FIG. 2B may be discrete components that can be assembled together, or they can be integral. Some or all of the mounting portion 222, the support portion 223, and the guide and lock portion 224, 225 can be manufactured by injection molding, machining, bending, or any other manufacturing process that can form the structure from any suitable material, such as plastic, sheet metal, and so on.

Figure 3:
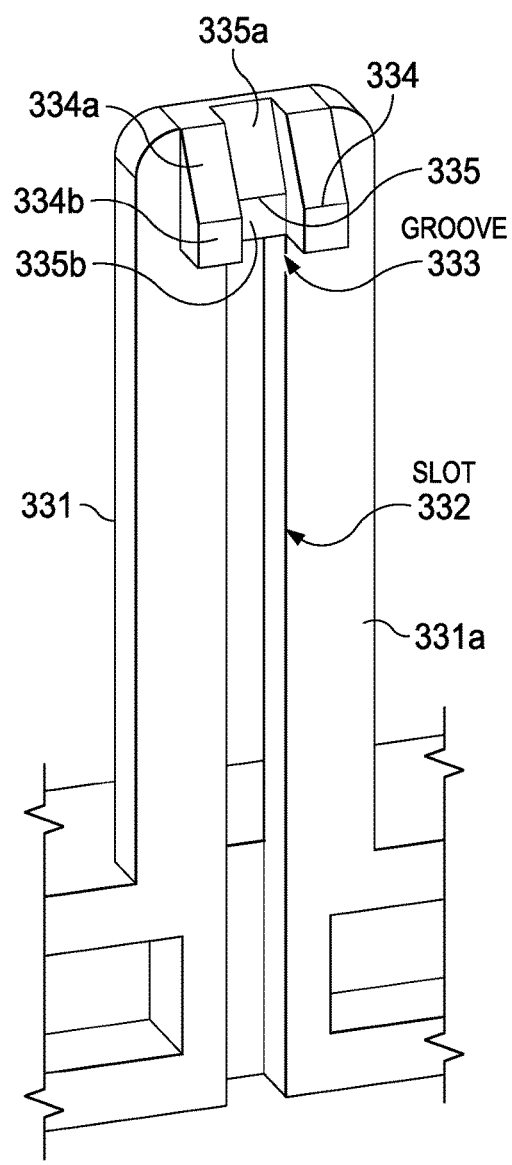
FIG. 3 shows an enlarged drawing of a guide and lock portion in FIGS. 2A and 2B according to the disclosure.

FIG. 3 shows an enlarged drawing of a guide and lock portion 224, 225 in FIGS. 2A and 2B according to the disclosure. As shown in FIG. 3, the guide and lock portion comprises two ribs 331, which extend up to a certain height from the top surface 227 of the support portion 223 and are connected by a lock portion 335 on their top ends. The two ribs 331 may be parallel to each other, and a slot 332 is formed between them. The slot 332 extends downward to the bottom surface 228 of the support portion 223 and upward to the lock portion 335.

The lock portion 335 is positioned between the two ribs 331 and has a top surface 335a and a front surface 335b. The top surface 335a may be inclined relative to the front sides 331a of the ribs 331 such that a child board can be guided into the slot 332 via the inclined top surface 335a and locked easily. In one embodiment, the top surface 335b may flush with the front side 331a of the rib 331. In another embodiment, the top surface 335b may be parallel to and lower than the front side 331a of the rib 331 such that the child board is limited in the slot 332 when it is assembled.

A projection 334 is formed on the top of each rib 331. As shown in FIG. 3, the projection 334 is located on the front side 331a and next to the lock portion 335. The projection 334 has a top surface 334a and a front surface 334b. The top surface 334a may be inclined relative to the front side 331a of the ribs 331, or the top surface 334b may be parallel to the front side 331a of the rib 331. The projections 334 on the ribs 331 are paired. A groove 333 is defined by the lock portion 335 and a pair of projections 334, which is used to guide the child board. The guide and lock structure is constituted of the lock portion 335, the projection 334, the groove 333, and the slot 332.

The person skilled in the art should realize that two or more lock portions 335 can be formed between the two ribs, and two or more pairs of projections 334 can be formed on the front side 331a of the ribs 331, although only one lock portion 335 and one pair of projections 334 are shown. Further, in one embodiment, in the case that the top surface 335b of the lock portion 335 may be lower than the front side 331a of the rib 331, the pair of projections 334 is not necessary. The person skilled in the art should realize that other structures that can achieve the similar function to the guide and lock portion in FIG. 3, existing or developed later, can be used.

Figure 4:
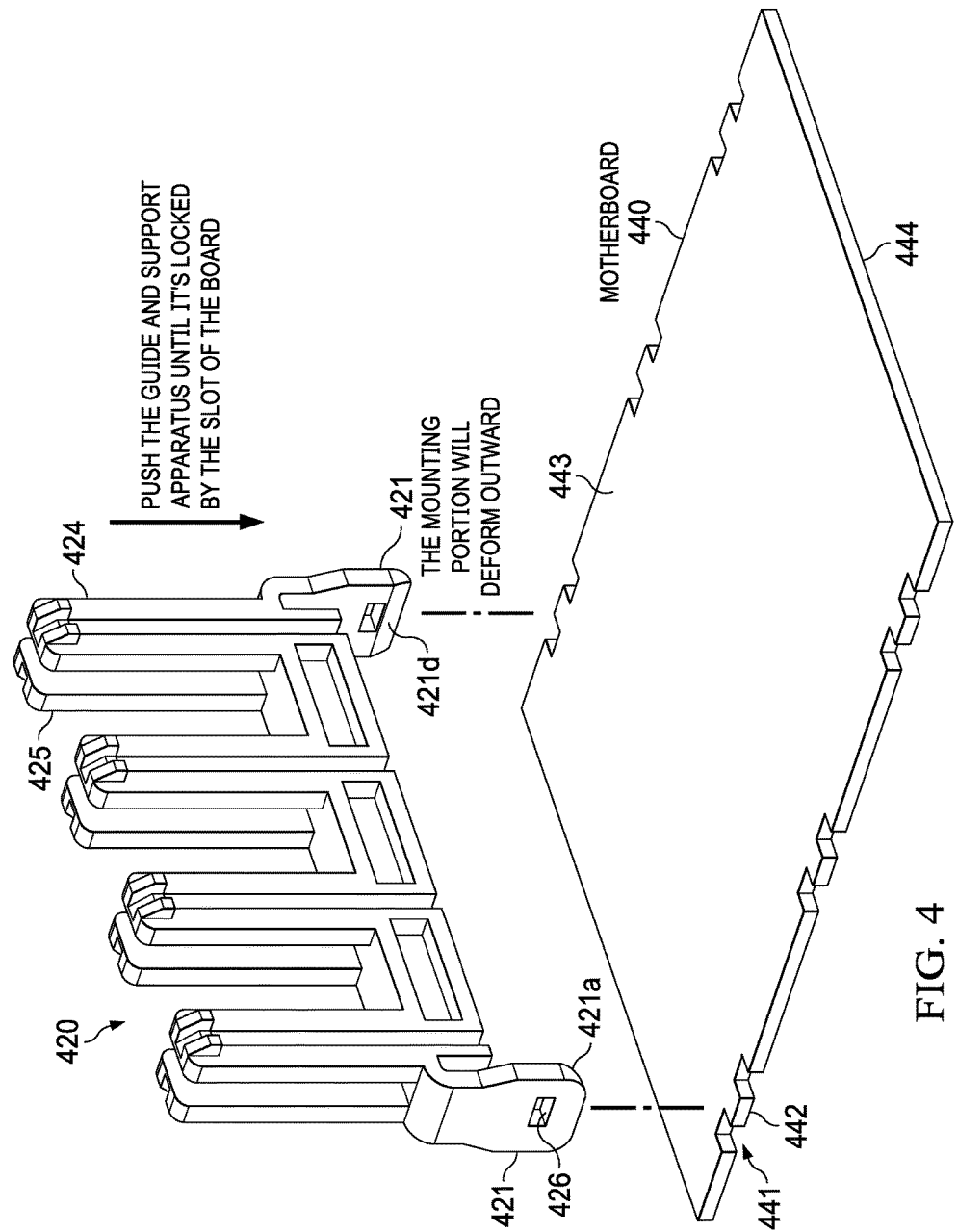
FIG. 4 shows an example process for mounting a guide and support apparatus onto a mother board that is a printed circuit board according to the disclosure.

FIG. 4 shows an example process for mounting a guide and support apparatus 420 onto a mother board 440 that is a printed circuit board according to the disclosure. As shown in FIG. 4, several slots 441 are formed at both right and left edges of the mother board 440 by cutting off some material from the mother board. The size of the slot 441 corresponds to that of the foot 421a of the mounting portion 421. A convex 442 is formed in each slot 441, preferably in the middle of the slot 441. The size of the convex 442 is matched with that of the hole 426 in the foot 421a of the mounting portion 421. The slots 441 and convexes 442 at both edges of the mother board 440 may be formed symmetrically.

In order to mount the guide and support apparatus 420 onto the mother board 440, firstly, the guide and support apparatus 420 is located to make the guide and lock portions 424, 425 perpendicular to the mother board 440 and the mounting portion 421 aligned with the slot 441 substantially.

Then, the guide and support apparatus 420 is moved toward the mother board 440 until the foot 421a of the mounting portion 421 contacts the convex 442 on the slot 441. After that, the mounting portion 421 will be deformed outward elastically, for example, by a force applied onto the slope face 421d.

Next, the guide and support apparatus 420 continues to move toward the mother board until the con vexes 442 are inserted into the holes 426 of the mounting portion 421. As such, the guide and support apparatus 420 is mounted and locked onto the mother board 440 vertically. The others guide and support apparatus 420 can be mounted onto the mother board 40 in a similar way.

Figure 1B:
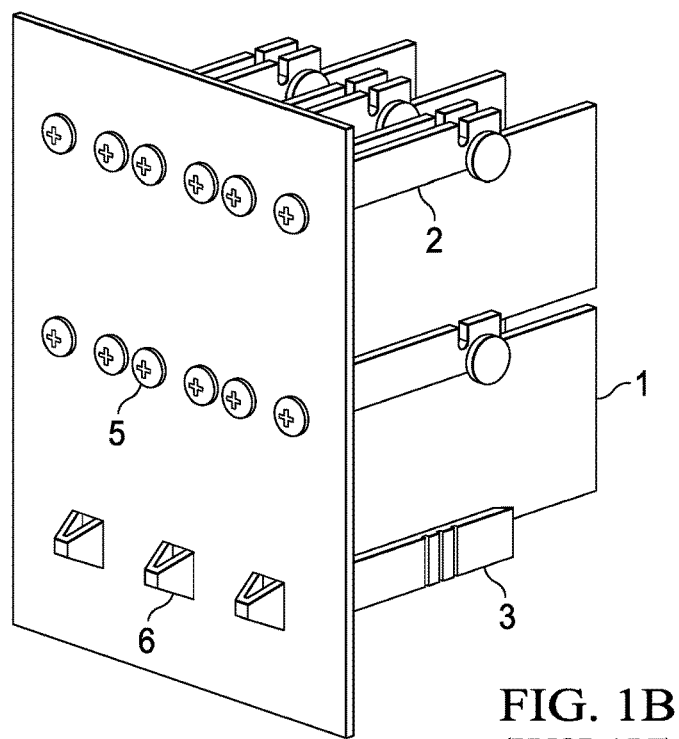
Figure 7A:
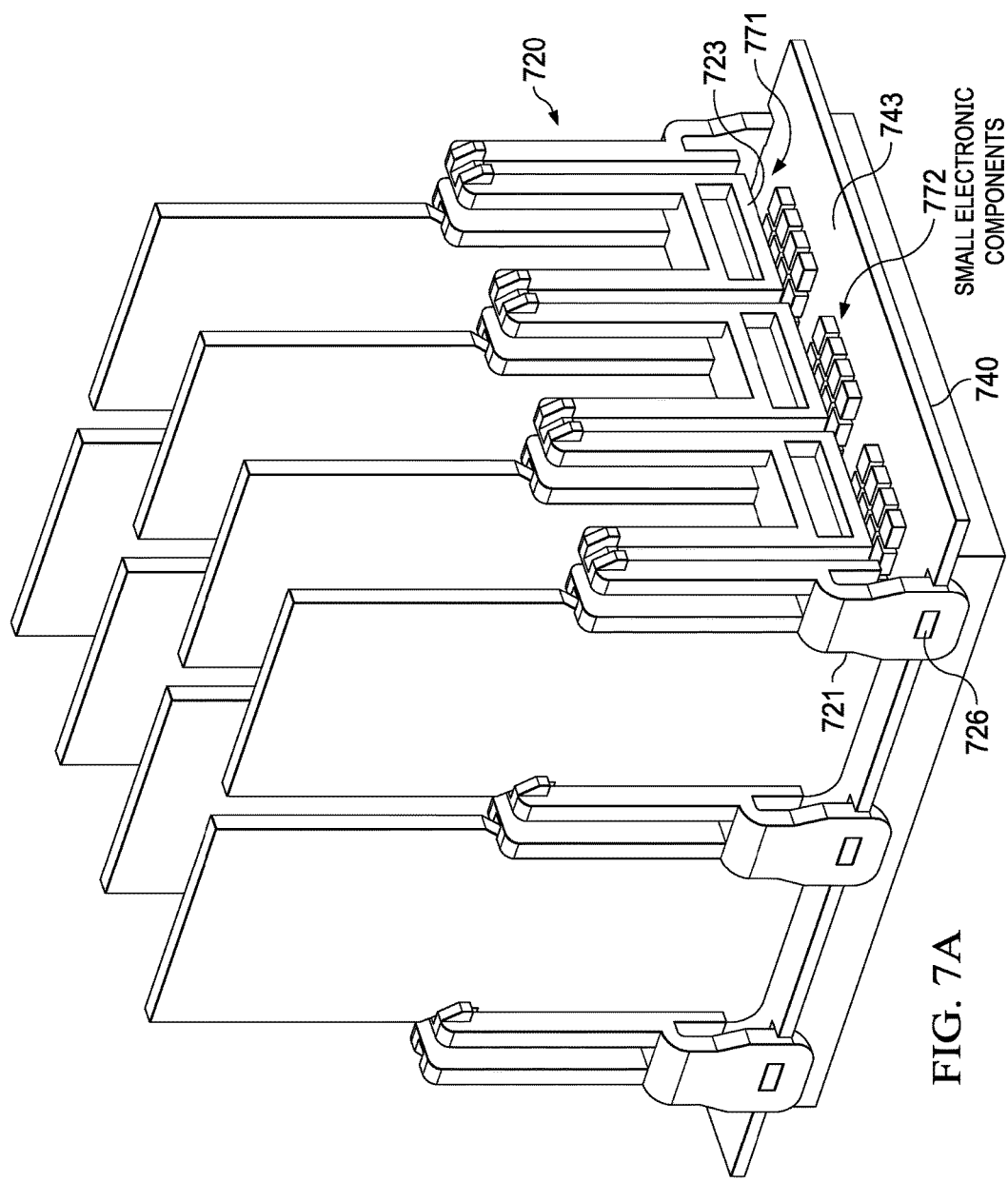
FIG. 7A shows a perspective diagram of an assembled board matrix viewed from a front side according to the disclosure.
Figure 7B:
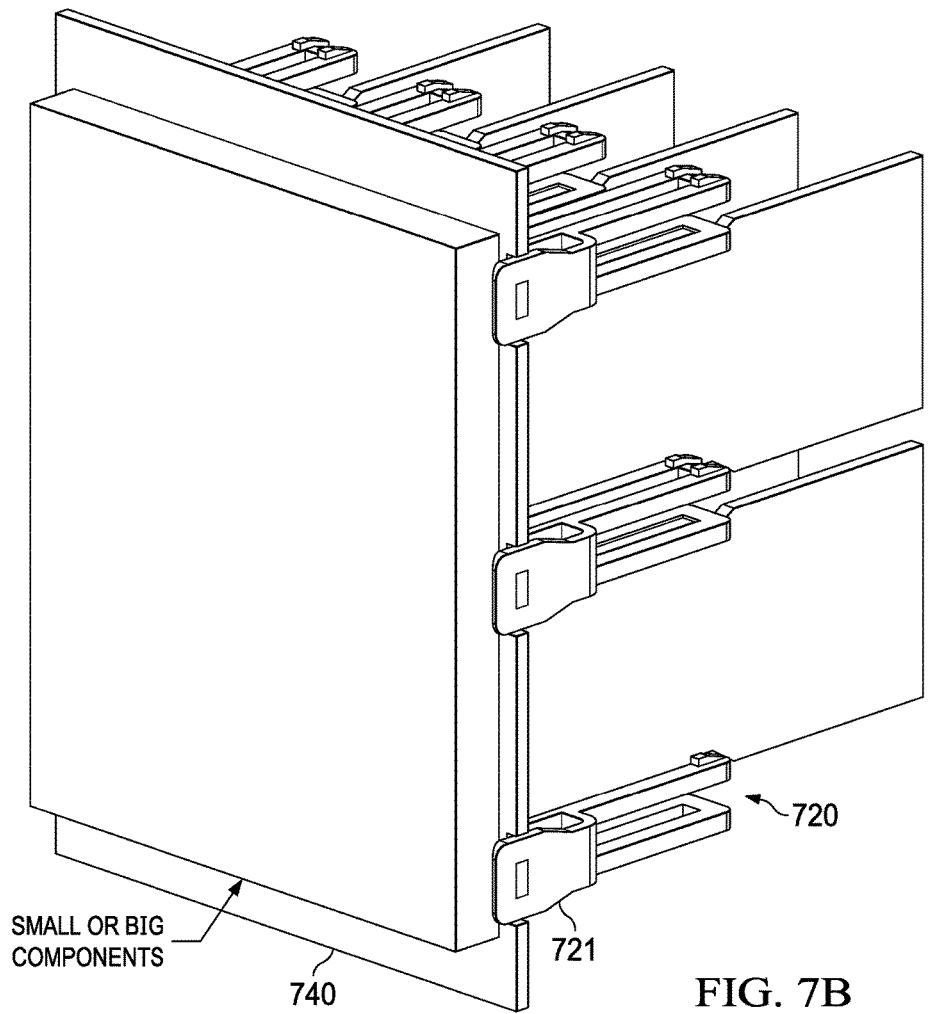
FIG. 7B shows another perspective diagram of an assembled board matrix viewed from a back side according to the disclosure.

In this way, the guide and support apparatus 420 is mounted on the mother board 440 without the use of screws 5 and the lock heads 6 on the back side as depicted in FIGS. 1A and 1B. Further, there are spaces formed between the bottom surface 428 of the support portion 423 and the upper side 443 of the mother board 440 because the level of the hole 426 is below the bottom surface of the support portion 423 as described in FIG. 2A. Therefore, the upper side and the back side both are not occupied by the guide and support apparatus 420. Thus, the upper side and the back side can be used to carry more electronic components on the mother board as depicted in FIGS. 7A and 7B.

In another embodiment, alternatively, instead of the slot 441 and convex 442 both formed at both edges of the mother board, only the convex 442 projects from both edges. The size of the convex 442 is matched with that of the hole 426 in the foot 221a of the mounting portion 421, and convexes 442 at both edges of the mother board 440 may be formed symmetrically.

Although the convex 442 and the hole 426 are used to lock and support the guide and support apparatus 420, the person skilled in the art should realize that some other locking and supporting structure can be used, as long as they can realize a similar effect.

Figure 5A:
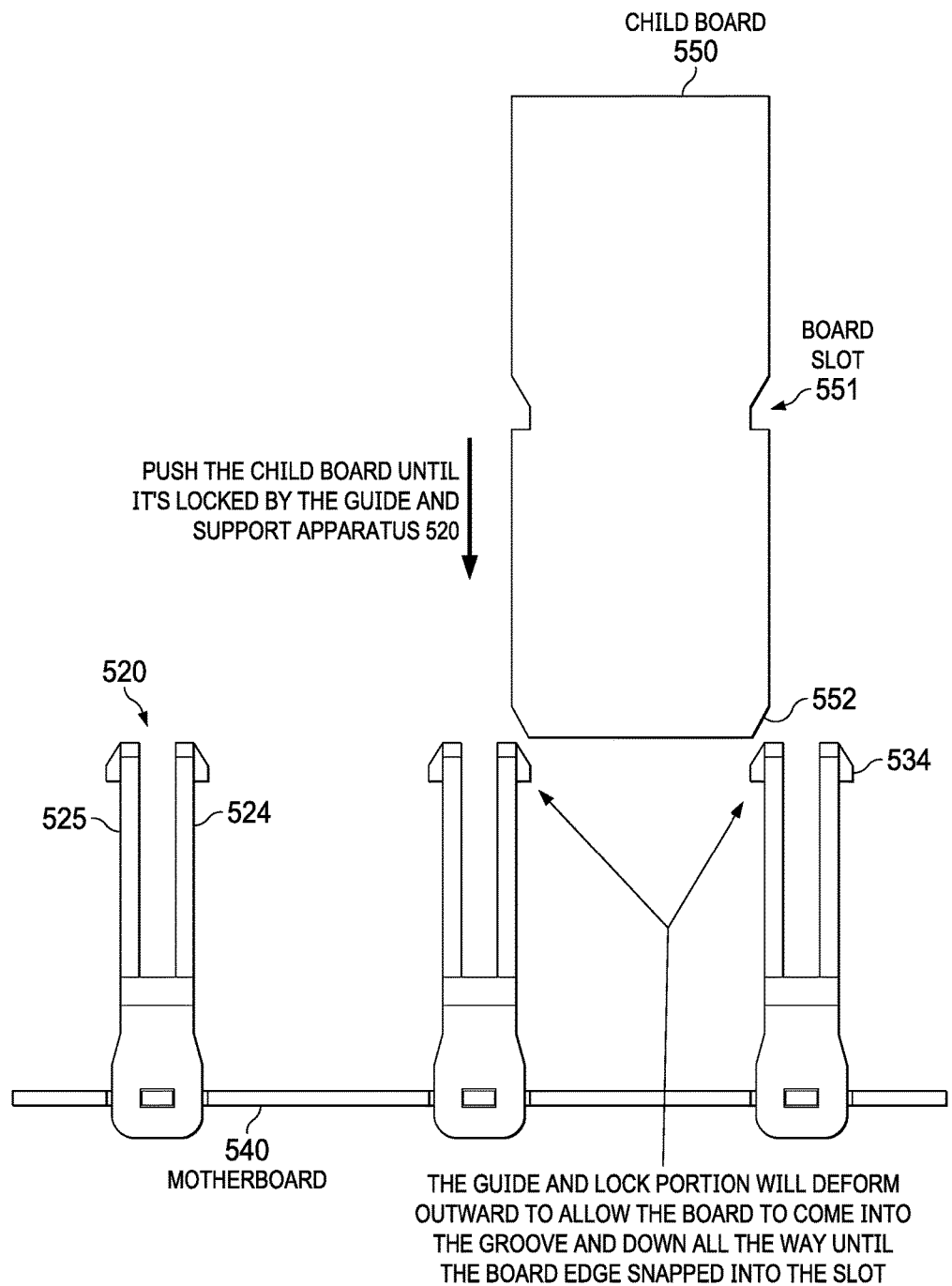
FIG. 5A shows an example process for mounting a child board into a guide and support apparatus according to the disclosure.

FIG. 5A shows an example process for mounting a child board 550 into a guide and support apparatus 520 according to the disclosure. Three guide and support apparatuses 520 are mounted onto the mother board 540 vertically. They are spaced apart by a distance, and their respective guide and lock structures are faced and aligned. As shown in FIG. 5A, a child board 550 is located above the mother board 540 and aligned with the space between two adjacent guide and support apparatuses 520. Two board slots 551 may be formed at left and right edges of the child board 550 to be locked with the lock portion 335 as shown in FIG. 3. The lower left and right corners of the child board 550 may be cut off to form respective slope structures 552, which match the top surface 335a of the lock portion 335 also as shown in FIG. 3.

When mounting the child board 550, firstly, the child board 550 is moved downward such that the slope structure 552 contacts the top surface 335a of the lock portion 335. Then, the board 550 is pushed to make the guide and lock portions 524 and 525 deformed outward to allow the child board 550 to come into the groove 333 as depicted in FIG. 3. The child board 550 keeps moving downward until the lock portion 335 comes into the board slot 551, where the board edge of the child board 550 snaps into the slot 332, and the child board 550 is locked by the guide and support portions 524 and 525. The other child boards 550 can be mounted onto the guide and lock portions 524 and 525 in a similar way. A board matrix may be formed that includes a mother board 540, one or more guide and support apparatuses 520, and a plurality of child boards 550 when all the child boards 550 are mounted in place.

Figure 5B:
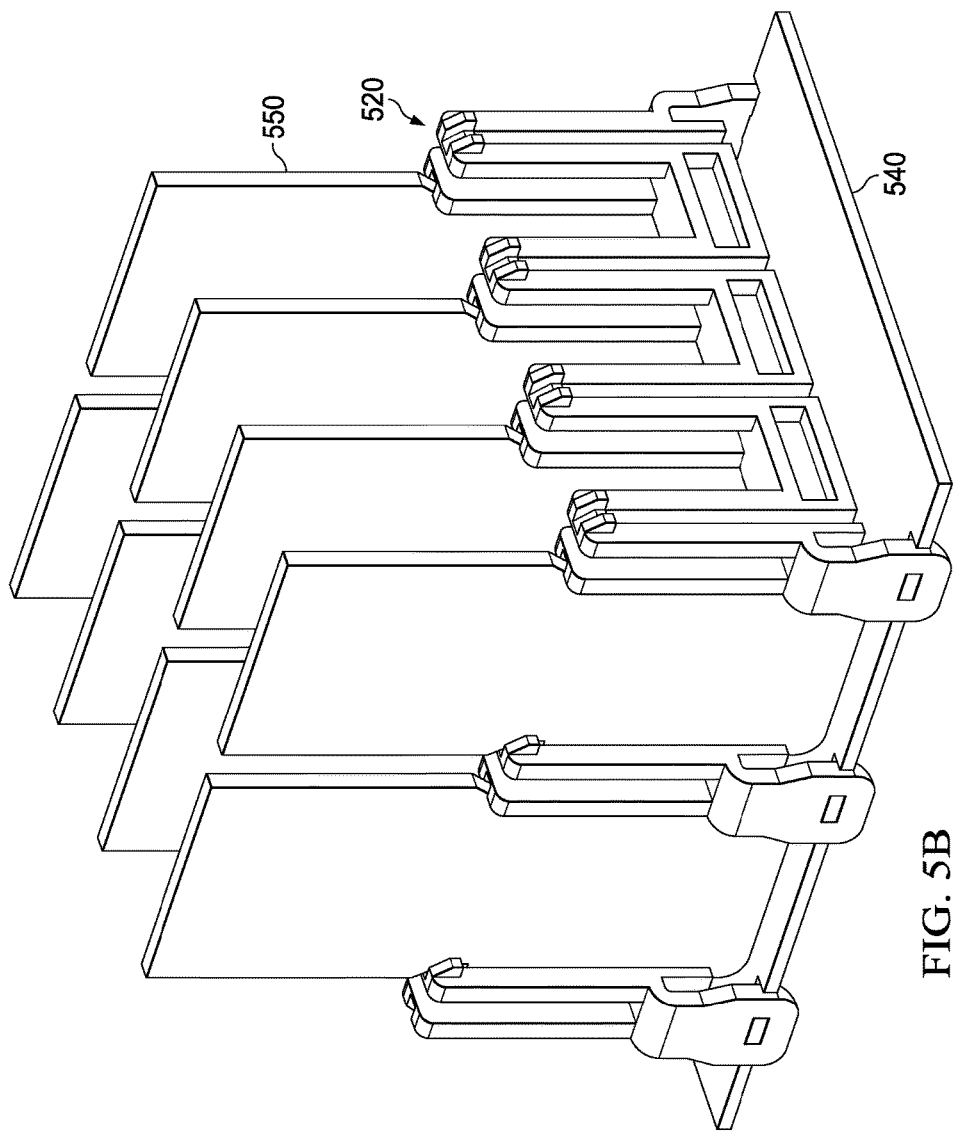
FIG. 5B shows a perspective diagram of an assembled board matrix according to the disclosure.

FIG. 5B shows a perspective diagram of an assembled board matrix according to the disclosure. As shown in FIG. 5B, three guide and support apparatuses 520 are mounted on the mother board 540, each guide and support apparatus 520 including four first guide and support portions 524 and four first guide and support portions 525. In that case, eight child boards 550 can be mounted on one mother board 540. As seen from these figures, all the guide and support apparatuses 520 and child boards 550 can be assembled easily, thus a compact and flexible design for board matrix is achieved.

Figure 6:
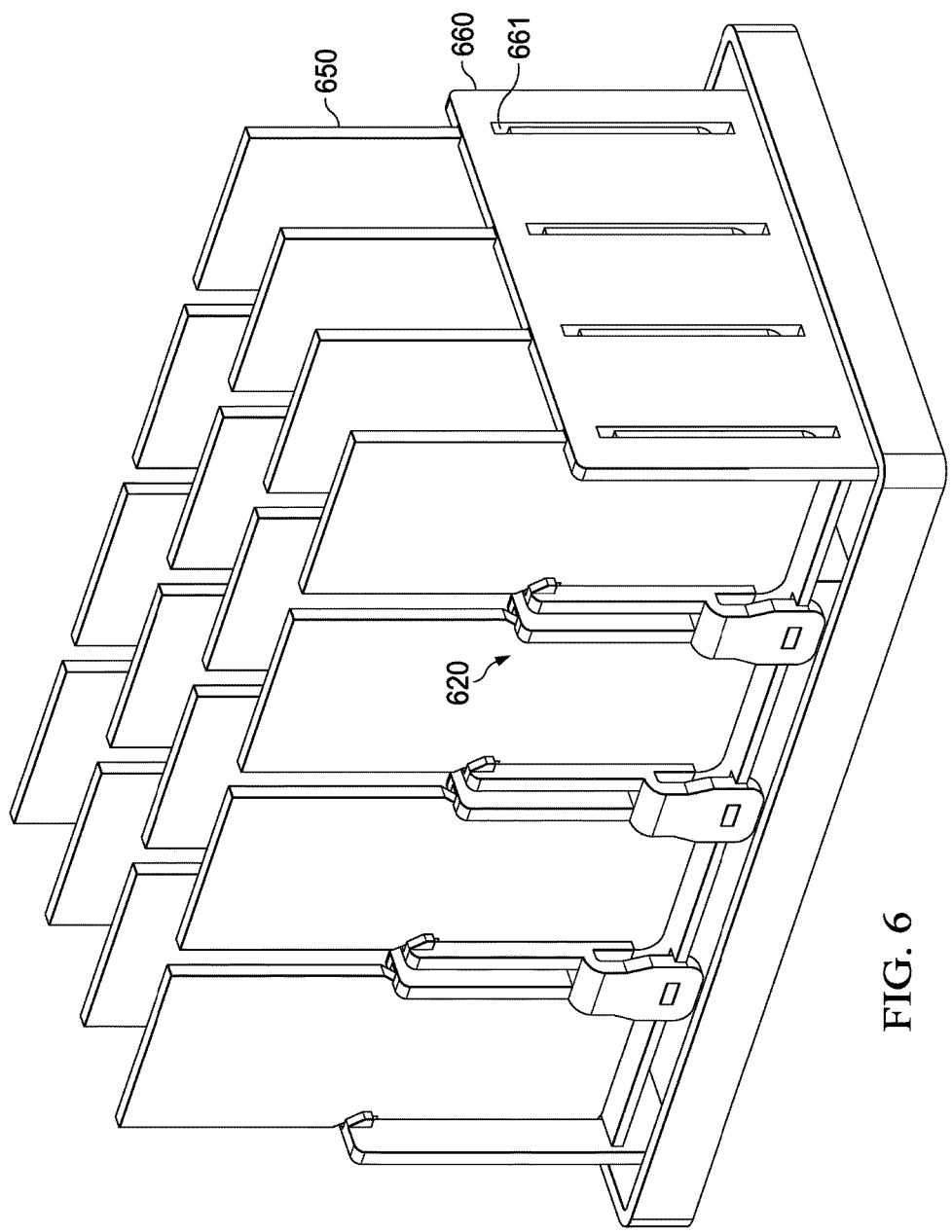
FIG. 6 shows a perspective diagram of another board matrix according to the disclosure.

FIG. 6 shows a perspective diagram of another board matrix according to the disclosure. As shown in FIG. 6, two covers 660 that are parallel to the guide and support apparatus 620 are provided at the edges of the mother board 660. Several trenches 661 are formed by cutting off some material from the cover 660. When mounted to the edges of the mother board 640, the trenches 661 are parallel to and aligned with the slot 332 on the guide and lock portion 224 as shown in FIG. 3. The child board 650 can be inserted between the guide and support apparatus 620 and the cover 660 and is locked by the trench 661. By use of the cover 660, more child boards 650 can be mounted onto the mother board 640. Thus, an even higher density design for electronic devices is achieved. The cover 660 can be made of plastic, sheet metal, or any suitable material.

FIG. 7A shows a perspective diagram of an assembled board matrix viewed from a front side according to the disclosure. As seen from FIG. 7A, there is a space 771 formed between the support portion 723 of the guide and support apparatus 720 and an upper side 743 of a mother board 740 because the level of the hole 726 in the mounting portion 721 is below the bottom surface of the support portion 723. A plurality of electronic components 772 can be mounted just under the guide and support apparatus 720.

FIG. 7B shows another perspective diagram of an assembled board matrix viewed from a back side according to the disclosure. As seen from FIG. 7B, the guide and support apparatus 720 is mounted onto the mother hoard 740 via the mounting portion 721 at both edges of the mother board 740 without use of screws 5 and lock heads 6 (as depicted in FIG. 1B) on the back side of the mother board 740. In other words, the back side of the mother board 740 is not occupied by any lock elements. Therefore, the space on the back side is also available for electronic components, for example, a relative big display screen. In this way, the mother board 740 can carry many child boards and have a lot of electronic components to be mounted thereon.

As seen from FIGS. 5-7, all the child boards mounted between two adjacent guide and support apparatuses must have the same width. However, in some cases, multiple child boards with different widths need to be mounted between two adjacent guide and support apparatuses. The solutions in FIGS. 5-7 cannot meet this requirement.

Figure 8A:
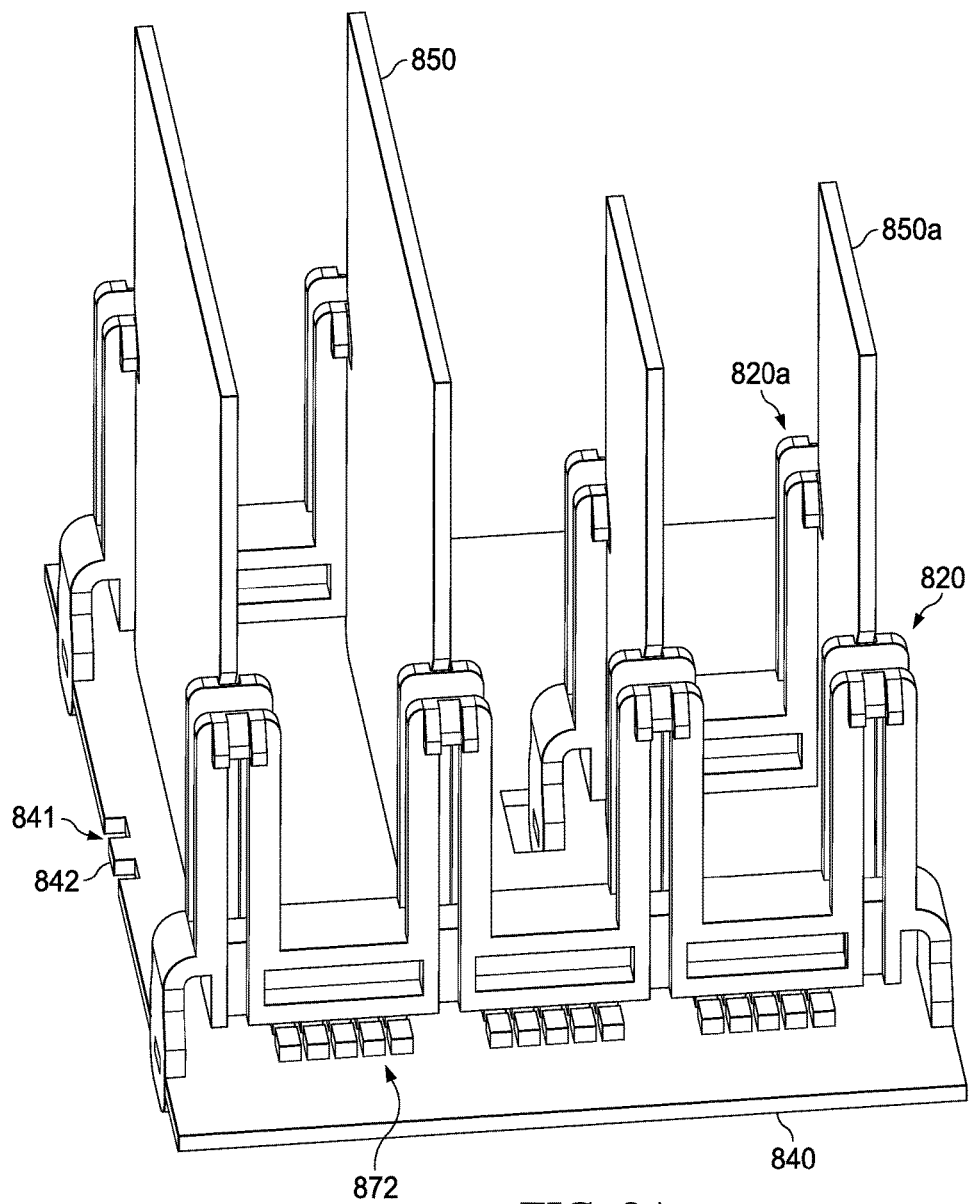
FIGS. 8A and 8B show another embodiment of a board matrix for child boards with different widths according to the disclosure.
Figure 8B:
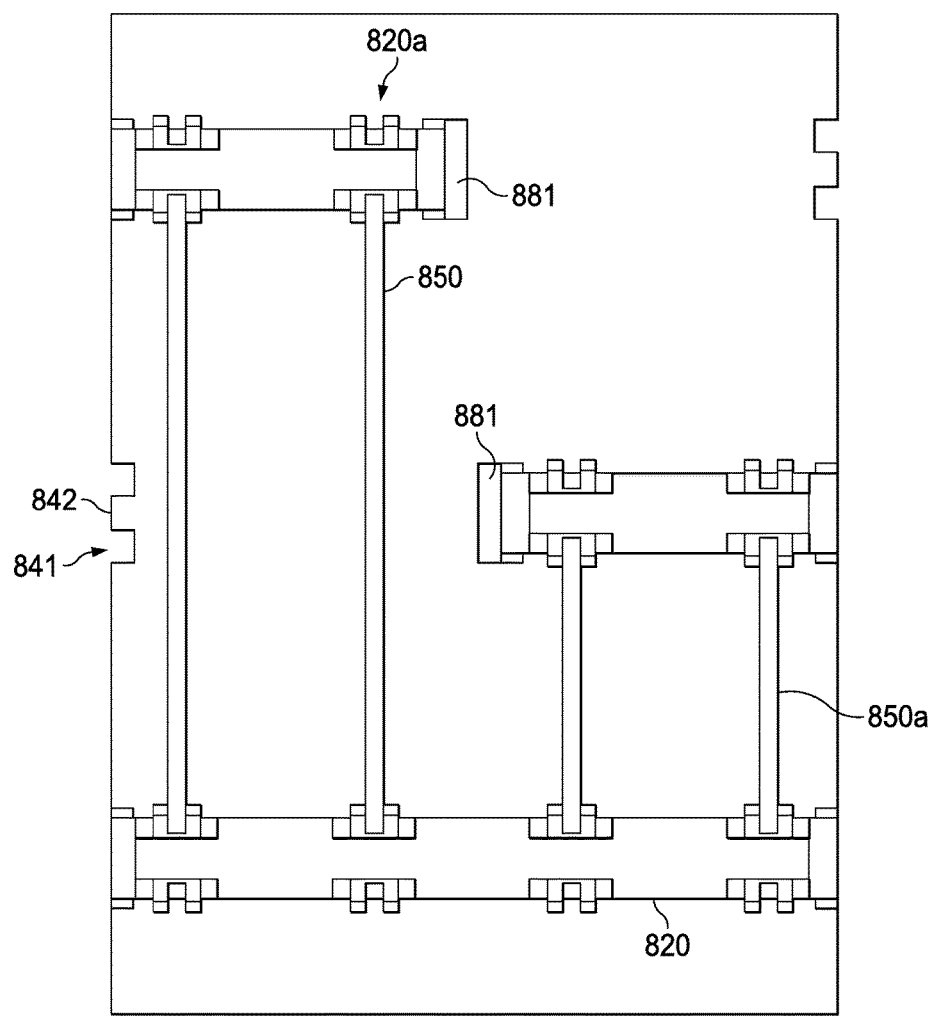

FIGS. 8A and 8B show another embodiment of a board matrix for child boards with different widths according to the disclosure. FIG. 8A is a perspective diagram of the assembled board matrix, and FIG. 8B is a top view of the assembled board matrix. As shown, the child boards 850 and 850a are different in width. Accordingly, the guide and support apparatuses 820 and 820a may be of different lengths. The lengths of the guide and support apparatuses 820 and 820a can be adjusted according to the number of the child board 850 and 850a. Mounting holes 881 are formed between the left and right edges of the mother board 840 by cutting off some materials from the mother board 840.

Several convexes 882 (not shown) are formed in the mounting holes 881 similar to the convex 442 as depicted in FIG. 4. The mounting hole 881 and convex 882 between the left and right edges align with the slots 841 or convexes 842 at both edges of the mother board 840. In this way, the guide and support apparatuses 820 with different lengths can be mounted via any two aligned convexes, for example, via two convexes 842 at the left and right edges of the mother board 840, via one convex 842 at one edge and one convex 882 between the two edges, and via two convex 882 between the two edges.

As shown in FIG. 8A, there is also a space formed between the guide and support apparatuses 820 with different lengths and the upper side of the mother board 840 when the different guide and support apparatuses 820 are mounted on the mother board 840, such that the electronic components 872 can be mounted just under the guide and support apparatuses 820 with different lengths.

Figure 9:
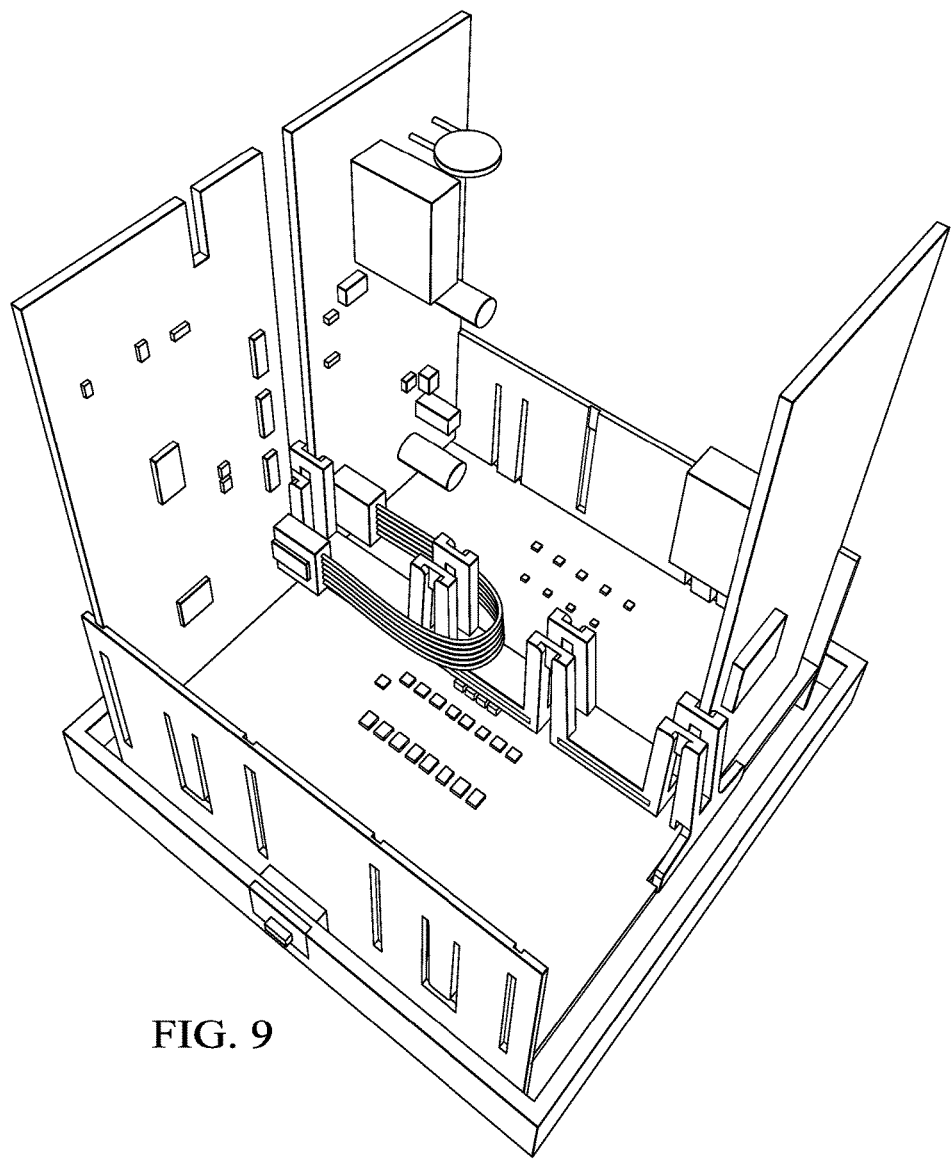
FIG. 9 is a photo of a board matrix in a completed product according to the disclosure.

FIG. 9 is a photo of a board matrix in a completed product according to the disclosure. As shown in FIG. 9, several child boards are mounted onto the mother board via the guide and support apparatus. The guide and support apparatus takes little on-board space on both sides of the printed circuit board or the mother board, and it is easy to build up a board matrix via the compact and flexible design of the guide and lock portion.

Example Embodiments

Example 1 includes a guide and support apparatus comprising a mounting portion, a support portion, and a guide and lock portion. The support portion extends perpendicularly to the guide and lock portion and ends at the mounting portion. The mounting portion extends downward from one or two ends of the support portion and comprises a lock structure. The guide and lock portion extends from the support portion vertically to a certain height.

Example 2 includes the guide and support apparatus according to example 1, where the lock structure is below the support portion.

Example 3 includes the guide and support apparatus according to example 1 or 2, where the support portion comprises a top surface and a bottom surface, the lock structure is a hole formed in the support portion, and the peak in the hole is below the bottom surface.

Example 4 includes the guide and support apparatus according to any one of examples 1-3, where the guide and lock portion is arranged to guide a child board, and the mounting portion can be mounted to a mother board via the lock structure such that the guide and support apparatus is mounted to the mother board.

Example 5 includes the guide and support apparatus according to example 4, where the mother board and the child board are printed circuit boards.

Example 6 includes the guide and support apparatus according to any one of examples 1-5, where, when the guide and support apparatus is mounted to a mother board via the mounting portion, a space can be formed between the support portion and the mother board.

Example 7 includes the guide and support apparatus according to example 6, where the space is between the bottom surface of the support portion and the upper side of the mother board.

Example 8 includes the guide and support apparatus according to any one of examples 1-7, where the guide and lock portion includes first and second guide and lock portions, which all extend from the support portion up to a certain height. The first guide and lock portion is located on the front side and the second guide and lock portion is located on the back side of the support portion.

Example 9 includes the guide and support apparatus according to example 8, where the first and second guide and lock portions are back to back, parallel, and aligned with each other.

Example 10 includes the guide and support apparatus according to example 8, where the first and second guide and lock portions are back to back, parallel, and interleaved with each other.

Example 11 includes the guide and support apparatus according to any one of examples 1-10, where the guide and lock portion comprises two ribs that extend up to the certain height from the support portion and that are connected by a lock portion on their top ends. A slot extends between the two ribs and ends with the lock portion.

Example 12 includes the guide and support apparatus according to example 11, where the lock portion is positioned between the two ribs and has a top surface and a front surface. The front surface is lower than the front side of the ribs such that a groove is defined by the front surface of the lock portion and the two ribs.

Example 13 includes the guide and support apparatus according to example 11, where the lock portion is positioned between the two ribs and has a top surface and a front surface. Two projections are formed next to the lock portion such that a groove is defined by the front surface of the lock portion and the two projections.

Example 14 includes the guide and support apparatus according to example 12 or 13, where the top surface of the lock portion is inclined relative to the front side of the ribs.

Example 15 includes a guide and support apparatus comprising a support portion and a guide and lock portion. The guide and lock portion extends from the support portion vertically to a certain height. The guide and lock portion includes first and second guide and lock portions. The guide and lock portion comprises two ribs that extend up to a certain height from the support portion and that are connected by a lock portion on their top ends. A slot extends between the two ribs and ends with the lock portion.

Example 16 includes the guide and support apparatus according to example 15, where multiple guide and lock portions on the support portion are grouped into first and second guide and lock portions. The first guide and lock portion is located on the front side and the second guide and lock portion is located on the back side of the support portion.

Example 17 includes the guide and support apparatus according to example 16, where the first and second guide and lock portions are back to back, parallel, and aligned or interleaved with each other.

Example 18 includes the guide and support apparatus according to any of examples 15-17, where the lock portion is positioned between the two ribs and has a top surface and a front surface. The front surface is lower than the front side of the ribs such that a groove is defined by the front surface of the lock portion and the two ribs.

Example 19 includes the guide and support apparatus according to any of examples 15-17, where the lock portion is positioned between the two ribs and has a top surface and a front surface. Two projections are formed next to the lock portion such that a groove is defined by the front surface of the lock portion and the two projections.

Example 20 includes a board matrix comprising a child board, a mother board, and the guide and support apparatus according to any of examples 1-19.

Example 21 includes a board matrix according to example 20, further comprising a cover. The cover is parallel to the guide and support apparatus and mounted at the edge of the mother board. Several trenches are formed such that the trenches are parallel to and aligned with the slot on the guide and lock portion.

Example 22 includes a method for manufacturing a guide and support apparatus comprising forming a support portion, forming a guide and lock portion that extends from the support portion to a certain height, and forming a mounting portion. The support portion extends perpendicularly to the guide and lock portion and ends at the mounting portion. The mounting portion extends downward from one or two ends of the support portion and comprises a lock structure. The lock structure is below the support portion.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A guide and support apparatus comprising:
    a mounting portion;
    a support portion; and
    a guide and lock portion;
        wherein the support portion extends to the guide and lock portion and ends at the mounting portion, the support portion comprises a top surface and a bottom surface, the mounting portion extends downward from one or two ends of the support portion and comprises a lock structure, the lock structure comprises a hole formed in the mounting portion, and the hole is below the bottom surface of the support portion and the guide and lock portion extends from the support portion to a certain height;
        wherein the guide and lock portion comprises two ribs that extend up to the certain height from the support portion and that are connected by a lock portion on their top ends, and a slot extends between the two ribs and ends with the lock portion; and
        wherein the lock portion is positioned between the two ribs and has a top surface and a front surface, and two projections are formed next to the lock portion such that a groove is defined by the front surface of the lock portion and the two projections, and the top surface of the lock portion is inclined relative to the front sides of the ribs.

2. The guide and support apparatus according to claim 1, wherein:
    the guide and lock portion is configured to guide a child board; and
    the mounting portion is configured to be mounted to a mother board via the lock structure such that the guide and support apparatus is mounted to the mother board.

3. The guide and support apparatus according to claim 1, wherein:
    the guide and lock portion includes first and second guide and lock portions that are respectively located on a front side and a back side of the support portion; and
    the first and second guide and lock portions are back to back, parallel, and aligned with each other.

4. The guide and support apparatus according to claim 1, wherein:

the guide and lock portion includes first and second guide and lock portions that are respectively located on a front side and a back side of the support portion; and the first and second guide and lock portions are back to back, parallel, and interleaved with each other.

5. The guide and support apparatus according to claim 1, wherein:

the lock portion is positioned between the two ribs and has a top surface and a front surface;

the front surface is lower than front sides of the ribs such that a groove is defined by the front surface of the lock portion and the two ribs; and the top surface of the lock portion is inclined relative to the front sides of the ribs.

6. A guide and support apparatus comprising a support portion; and a guide and lock portion;

wherein the guide and lock portion extends from the support portion to a certain height, the support portion comprises a top surface and a bottom surface;

wherein the guide and lock portion comprises two ribs that extend up to the certain height from the support portion and are connected by a lock portion on their top ends;

wherein a slot extends between the two ribs and ends with the lock portion;

wherein the lock portion is positioned between the two ribs and has a top surface and a front surface;

wherein two projections are formed next to the lock portion such that a groove is defined by the front surface of the lock portion and the two projections; and wherein the top surface of the lock portion is inclined relative to the front side of the ribs, a mounting portion, wherein the mounting portion extends downward from one or two ends of the support portion and comprises a lock structure, the lock structure comprises a hole formed in the mounting portion, and the hole is below the bottom surface of the support portion.

7. A board matrix comprising:

a child board;

a mother board; and a guide and support apparatus comprising:

a mounting portion;

a support portion; and a guide and lock portion;

wherein the support portion extends to the guide and lock portion and ends at the mounting portion, the support portion comprises a top surface and a bottom surface, the mounting portion extends downward from one or two ends of the support portion and comprises a lock structure, the lock structure comprises a hole formed in the mounting portion, and the hole is below the bottom surface of the support portion; and the guide and lock portion extends from the support portion to a certain height, wherein the guide and lock portion comprises two ribs that extend up to the certain height from the support portion and that are connected by a lock portion on their top ends, and a slot extends between the two ribs and ends with the lock portion; and wherein the lock portion is positioned between the two ribs and has a top surface and a front surface, and two projections are formed next to the lock portion such that a groove is defined by the front surface of the lock portion and the two projections, and the top surface of the lock portion is inclined relative to the front sides of the ribs.

8. The board matrix according to claim 7, further comprising:

a cover mounted at an edge of mother board;

wherein the cover includes a trench that is parallel to and aligned with a slot of the guide and lock portion.

9. The board matrix according to claim 7, wherein:

the guide and lock portion includes first and second guide and lock portions that are respectively located on a front side and a back side of the support portion; and the first and second guide and lock portions are back to back, parallel, and aligned with each other.

10. The board matrix according to claim 7, wherein:

the guide and lock portion includes first and second guide and lock portions that are respectively located on a front side and a back side of the support portion; and the first and second guide and lock portions are back to back, parallel, and interleaved with each other.

11. The board matrix according to claim 7, wherein:

the guide and lock portion comprises two ribs that extend up to the certain height from the support portion and that are connected by a lock portion on their top ends;

a slot extends between the two ribs and ends with the lock portion;

the lock portion is positioned between the two ribs and has a top surface and a front surface;

the front surface is lower than front sides of the ribs such that a groove is defined by the front surface of the lock portion and the two ribs; and the top surface of the lock portion is inclined relative to the front sides of the ribs.

12. A board matrix comprising:

a child board;

a mother board; and a guide and support apparatus comprising:

a support portion; and a guide and lock portion;

wherein the guide and lock portion extends from the support portion to a certain height, the support portion comprises a top surface and a bottom surface, wherein the guide and lock portion comprises two ribs that extend up to the certain height from the support portion and are connected by a lock portion on their top ends;

wherein a slot extends between the two ribs and ends with the lock portion;

wherein the lock portion is positioned between the two ribs and has a top surface and a front surface;

wherein two projections are formed next to the lock portion such that a groove is defined by the front surface of the lock portion and the two projections; and wherein the top surface of the lock portion is inclined relative to the front side of the ribs;

a mounting portion, wherein the mounting portion extends downward from one or two ends of the support portion and comprises a lock structure, the lock structure comprises a hole formed in the mounting portion, and the hole is below the bottom surface of the support portion.

13. The board matrix according to claim 12, further comprising:

a cover mounted at an edge of mother board;

wherein the cover includes a trench that is parallel to and aligned with a slot of the guide and lock portion.

14. A method for manufacturing a guide and support apparatus, the method comprising:
- forming a support portion;
- forming a guide and lock portion that extends from the support portion to a certain height; and
- forming a mounting portion;
- wherein the support portion extends to the guide and lock portion and ends at the mounting portion, the support portion comprises a top surface and a bottom surface, the mounting portion extends downward from one or two ends of the support portion and comprises a lock structure, the lock structure comprises a hole formed in the mounting portion, and the hole is below the bottom surface of the support portion and the lock structure is below the support portion;
- wherein the guide and lock portion comprises two ribs that extend up to the certain height from the support portion and that are connected by a lock portion on their top ends, and a slot extends between the two ribs and ends with the lock portion; and
- wherein the lock portion is positioned between the two ribs and has a top surface and a front surface, and two projections are formed next to the lock portion such that a groove is defined by the front surface of the lock portion and the two projections, and the top surface of the lock portion is inclined relative to the front sides of the ribs.

15. The method of claim 14, wherein:
- the guide and lock portion includes first and second guide and lock portions that are respectively located on a front side and a back side of the support portion; and
- the first and second guide and lock portions are back to back, parallel, and aligned or interleaved with each other.

\* \* \* \* \*